United States Patent [19]
Agan

[11] Patent Number: 5,669,684
[45] Date of Patent: Sep. 23, 1997

[54] LOGIC LEVEL SHIFTER WITH POWER ON CONTROL

[76] Inventor: Tom A. Agan, 7064 Carey La., Maple Grove, Minn. 55369

[21] Appl. No.: 570,170

[22] Filed: Dec. 7, 1995

[51] Int. Cl.$^6$ .............................................. H03K 19/0185
[52] U.S. Cl. ............................. 326/81; 326/33; 326/68
[58] Field of Search ............................ 326/33, 63, 68, 326/80, 81, 121

[56] References Cited

U.S. PATENT DOCUMENTS

| | | |
|---|---|---|
| 4,486,670 | 12/1984 | Chan et al. . |
| 4,490,633 | 12/1984 | Noufer et al. ............... 326/80 X |
| 4,978,870 | 12/1990 | Chen et al. .................. 326/81 X |
| 5,113,097 | 5/1992 | Lee ............................. 326/68 X |
| 5,136,190 | 8/1992 | Chern et al. ................... 326/81 |
| 5,223,751 | 6/1993 | Simmons et al. . |
| 5,406,140 | 4/1995 | Wert et al. .................. 326/68 |
| 5,422,523 | 6/1995 | Roberts et al. ............. 326/81 X |
| 5,583,454 | 12/1996 | Hawkins et al. ............. 326/81 |

*Primary Examiner*—David R. Hudspeth

[57] ABSTRACT

Logic level shifter for coupling a first logic circuit having a first voltage level power supply to a second logic circuit with the shifter and the second logic circuit having a second voltage level power supply and with the second voltage level supply applied at a time when the first level voltage supply is not applied. The level shifter maintains its outputs at either a reference ground voltage or the second level voltage when the second level voltage supply is present and the first level voltage supply is not present.

11 Claims, 1 Drawing Sheet

LOGIC LEVEL SHIFTER WITH POWER ON CONTROL

BACKGROUND OF THE INVENTION

The Government has rights in this invention pursuant to Contract No. F29601-89-C-0084, awarded by The Department of the Air Force.

The present invention relates to digital level shifters and more specifically to CMOS low power level shifters. Level shifters are required when data or control signals must pass between digital logic circuits having two different power supply voltages.

Many applications of integrated circuits are requiring lower power supply voltages. While historically it was common to utilize 5 volt supplies, presently there are requirements for 3.3 volt, 2.5 volt and even lower voltage supplies for portions of systems. The reasons for this requirement include lower power consumption and the fact that improved performance is obtained when the voltage swing is limited to a lower value. The lower power supply voltages may be required for only a portion of a system, but the portion of the system having the lower power supply voltage must be able to communicate with other portions of the system having higher power supply voltages. For example, a single application specific integrated circuit (ASIC) may be designed to have both 3.3 volt and a 5 volt power supply zones. Separate power supply zones raise an issue as to power being applied at different times in different zones and how this will affect the operation and power consumption of the logic circuits. For example, a logic stage preceding a level shifter may operate with a 2.5 volt supply voltage while the level shifter and the logic stage following the level shifter may operate with a 5 volt supply voltage. If the 5 volt supply is applied before the 2.5 volt supply, the output(s) of the level shifter may float to intermediate level voltages. These intermediate levels can cause both p-channel and n-channel transistors in the logic stage following the level shifter to be partially on, resulting in DC current in the logic stage and in excessive power consumption. This DC current is referred to as "crow bar" current. This "crow bar" current will continue to flow between the power supply and ground of the following stages until the 2.5 volt power supply is applied. Additional logic stages downstream can also be affected in the same way. A similar situation occurs if both the 2.5 volt and the 5 volt supplies are operating, and then the 2.5 volt supply is turned off but the 5 volt supply remains turned on.

The problem just described is of course not limited to a single ASIC. For example, a core portion of a system may utilize 3.3 volts with the input/output (I/O) having some 3.3 volt integrated circuits (IC's) and some 5 volt IC's. The 3.3 volt supply is referred to as the core voltage, $V_C$, and the 5 volt supply is referred to as the ring voltage, $V_R$. In order for the core to communicate with the 5 volt IC's a translator or level shifter is required to translate the 3.3 volts to the 5 volt ring voltage supply and similar problems of intermediate output values can occur.

In the past the solution to this problem just described as been to require the designer of the system to assure that the power supplies come on at the same time or to simply accept the additional power drain.

Thus a need exists for a digital logic level shifter that does not introduce intermediate values into the circuitry as a result of the presence or absence of power supply voltages.

SUMMARY OF THE INVENTION

The present invention solves these and other needs by providing a logic level shifter for coupling a first logic circuit having a first voltage level power supply to a second logic circuit with the shifter and the second logic circuit having a second voltage level supply and with the second voltage level supply applied at a time when the first level voltage supply is not applied. In the preferred form, the level shifter accepts a first logic signal which can vary from a reference voltage to the first voltage and a second logic signal which is a complement of the first logic signal and can vary from a reference voltage to the first voltage. A first output provides a signal which can vary from the reference voltage to the second voltage and a second signal which is the complement of the first output signal. The logic level shifter includes means for maintaining the first output and the second output at either the reference voltage or the second voltage during times when the first voltage level power supply is not present.

DETAILED DESCRIPTION

Figures 1, 1A:
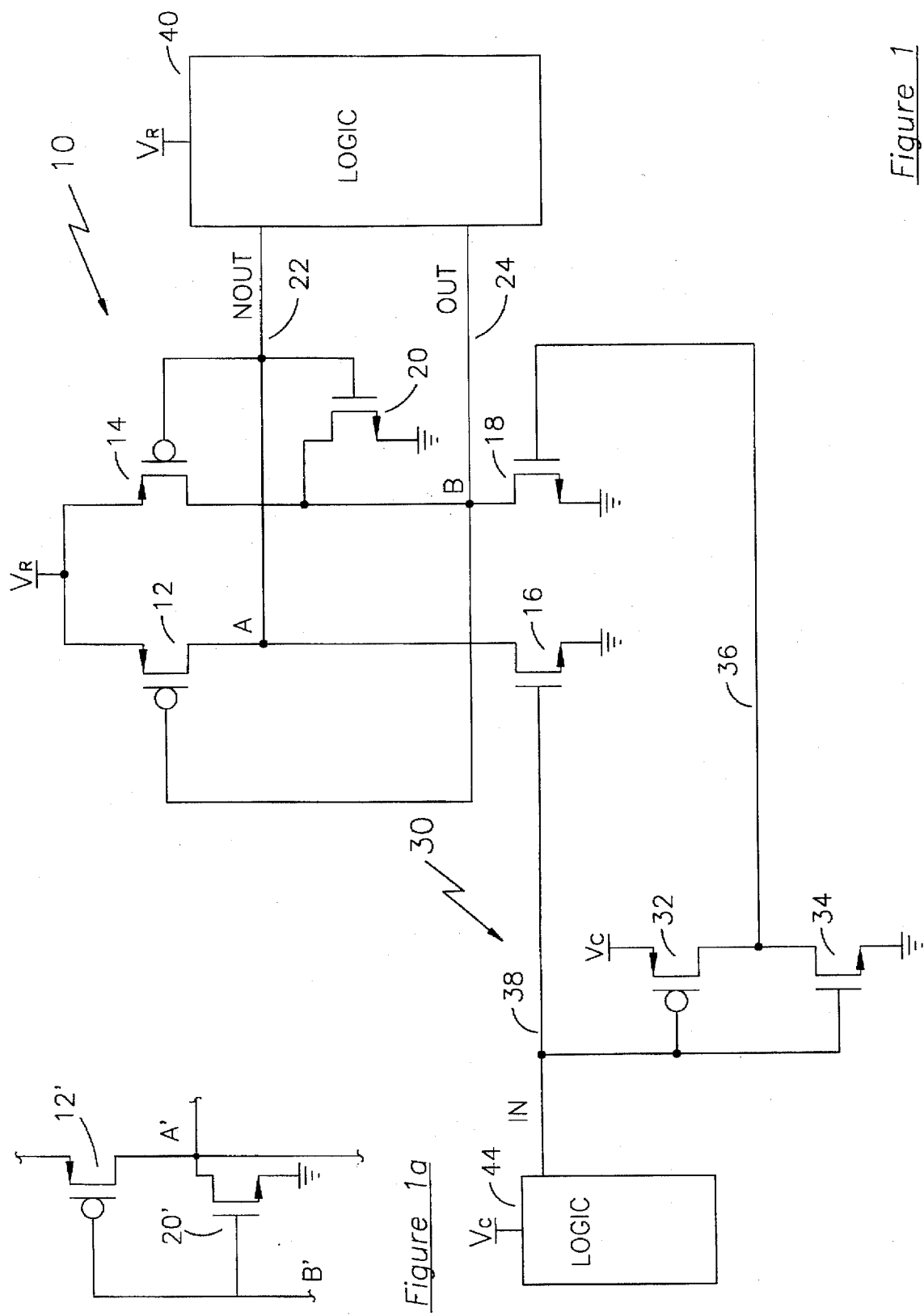
FIG. 1 is a schematic of a logic level shifter in accordance with the principles of the present invention.
FIG. 1a is a schematic of a portion of FIG. 1 and shows an alternate arrangement.

In FIG. 1, a logic level shifter 10 in accordance with the principles of the present invention includes p-channel MOB transistors 12 and 14, and n-channel MOS transistors 16, 18, and 20. Level shifter 10 is powered by a single power supply level $V_R$. The source of p-channel transistor 12 is connected to voltage $V_R$, the source of n-channel transistor 16 is connected to a reference voltage (ground) and the drains of transistors 12 and 16 are connected at point A which is connected to the gate of p-channel transistor 14 and to output 22. The source of p-channel transistor 14 is connected to voltage $V_R$, the source of n-channel transistor 18 is connected to ground and the drains of transistors 14 and 18 are connected at point B which is connected to the gate of p-channel transistor 12 and to output 24. N-channel transistor 20 has its source connected to a reference voltage, (ground), its drain connected to the common drain connection of transistors 16 and 18, and its gate connected to output 22.

In the preferred form shown in FIG. 1, level shifter 10 includes inverter 30 which receives digital signals at 38 from logic circuit 44. Logic circuit 44 operates at a core voltage, $V_C$. Inverter 30 includes p-channel MOS transistor 32 and n-channel MOS transistor 34. The source of p-channel transistor 32 is connected to a first supply voltage designated $V_C$, with the source of n channel transistor 34 connected to a reference voltage (ground). The gates of transistors 32 and 34 have a common connection which forms an input to inverter 30. The drains of transistors 32 and 34 have a common connection to an output 36. In the operation of inverter 30, digital input signals are provided at input 38 which is connected to the gates of transistors 32 and 34. If the voltage level of digital input signal 38 is high corresponding to a "1" logic state, n-channel transistor 34 will be turned on, pulling output 36 to ground which corresponds to a low logic state, thus inverting the input signal at 38. Conversely when the voltage level at 38 is low, n-channel transistor 34 will be turned off and p-channel transistor 32 will be turned on pulling output 36 to the value of $V_C$ corresponding to a high or "1" logic state.

The operation of level shifter 10 will be explained by assuming that inverter 30 is operating with a core voltage, $V_C$, of 3 volts and level shifter 10 is operating with a ring voltage, $V_R$, of 5 volts, it is understood that these voltages are only for illustration purposes and other voltages may be used. In the operation of level shifter 10, with a logic level 1 (3 volts) at input 38, n-channel transistor 34 will be turned on and the signal 36, which is the inverse of signal 38, will be low which will turn off n-channel transistor 18. The logic level 1 signal at input 38 will turn on n-channel transistor 16 which will cause point A to and output 22 to be low. With node A low, p-channel transistor 14 is turned on and node B and output 24 will be high, i.e., at the voltage of $V_R$ or 5 volts.

With a logic level 0 (0 volts) at input 38, p-channel transistor 32 will be turned on, n-channel transistor 34 will be turned off and output 36 of inverter 30 will be high. With input 38 low, n-channel transistor 16 will be off. High output 36 will turn on n-channel transistor 18 causing node B to be low which will turn on p-channel transistor 12 causing node A and output 22 to be high.

The present invention provides a solution to a problem that arises if power is applied to level shifter 10, i.e., at $V_R$, before power is applied at inverter 30, i.e., at $V_C$, and transistor 20 is not present. With no voltage applied at $V_C$, n-channel transistor 16 and n-channel transistor 18 will be turned off. When voltage is then applied at $V_R$, and with no transistor 20 present, p-channel transistor 12 will begin to turn on resulting in an intermediate voltage at node A and p-channel transistor 14 will begin to turn on resulting in an intermediate voltage at node B. With no transistor 20, the intermediate voltage at node A and the intermediate voltage at node B will exist until power is applied at $V_C$. With an intermediate voltage at output 22 or output 24 the next or following logic stage 40 and all the logic stages which follow logic stage 40 may have both n-channel and p-channel transistors turned on at the same time resulting in dc crowbar current.

In accordance with the present invention an n-channel transistor 20 is used to prevent intermediate voltages at node A and node B when power is applied at Vn before power is applied at $V_C$. The drain of transistor 20 is connected to the common connection between the drains of p-channel transistor 14 and n-channel transistor 18, the source of transistor 20 is connected to ground and the gate of transistor 20 is connected to node A.

In operation, when power is applied at $V_R$ at a first time and with no power applied at $V_C$, n-channel transistors 16 and 18 will be turned off. As the voltage at $V_R$ begins to rise, both p-channel transistor 12 and p-channel transistor 14 will begin to turn on. This will cause the voltage at node A and at node B to begin to rise. If the voltage at node A rises enough to begin to turn on n-channel transistor 20, then node B will be strongly pulled down to a low value. This causes p-channel transistor 12 to turn on which causes node A to go to a high value. Thus, the problem of an intermediate voltage going to a logic gate that follows level shifter 10 has been solved because output 24 will be at a reference voltage (ground) and output 22 will be at the voltage of $V_R$.

In the preferred embodiment, FIG. 1, the drain of n-channel transistor 20 is connected to the drain of p-channel transistor 14. It will be understood that alternatively, transistor 20 could have been connected as shown in FIG. 1a, where a prime (') is used to denote similar components. In FIG. 1a, transistor 20' has its drain connected to the drain of p-channel transistor 12', its source connected to a reference voltage (ground) and its gate connected to node B'. When connected in this way, if the voltage at node B' rises enough to turn on transistor 20', then the voltage at node A' will be pulled down to a low value. With reference to FIG. 1, this would cause p-channel transistor 14 to turn on which would cause node B to go to a high value so that output 24 would be at ground and output 22 will be at voltage $V_R$.

Referring again to FIG. 1, there are differences in the delay introduced by level shifter 10 when input 38 goes from low to high as compared to when input 38 goes from high to low. These differences can affect the pulse width of the signal.

When input 38 goes from low to high, transistor 16 is turned on and pulls down output 22. Therefore, only one transistor needed to be turned on to cause output 29, to change. When input 38 goes from high to low, transistor 16 is turned off, transistor 39, is turned on, which turns on transistor 18 which pulls down node B, which turns on transistor 19, which pulls up output 9.2 which turns on transistor 20 which also pulls down node B. Note that more transistors must be turned on to cause output 22 to change after input 38 goes from high to low. These differences in delay need to be considered in view of the specific application in order to make a choice of whether to use the connection of FIG. 1 or the connection of FIG. 1a.

In addition, inverter 30 is shown in FIG. 1. It will be recognized that logic circuit 44 may provide both input 38 and its complement or signal 36. In this case inverter 30 would not be necessary.

The present invention provides a solution to the problem of power supply zones being applied at different times. The solution includes a single additional transistor which may easily be designed into digital logic circuits.

The scope of the invention is to be indicated by the appended claims, rather than by the foregoing description.

We claim:

1. A logic level shifter for coupling a first logic circuit having a first voltage level power supply to a second logic circuit, said shifter and said second logic circuit having a second voltage level supply, with said second voltage level supply being present at a time when said first level voltage supply is not present, comprising:

first input means for accepting a first logic signal from said first logic circuit wherein said first logic signal can vary from a reference voltage to said first voltage;

second input means for accepting a complement of said first logic signal;

first output means for providing a first output which can vary from said reference voltage to said second voltage; and means for maintaining said first output at said reference voltage or at said second voltage during a first time period when said second voltage level power supply is present and said first voltage level power supply is not present.

2. Logic level shifter of claim 1, further comprising:

first and second transistors of a first conductivity type;

third and fourth transistors of a second conductivity type;

said first transistor and said third transistor connected in series between said second voltage level supply and a reference voltage with said first input means at said third transistor;

said second transistor and said fourth transistor connected in series between said second voltage level supply and said reference voltage with said second input means at said fourth transistor;

a gate of said first transistor coupled to a drain of said second transistor;

a gate of said second transistor coupled to a drain of said first transistor;

said first output means coupled to a drain of said second transistor; and said means for maintaining said first output at said reference voltage or at said second voltage during said first time period includes feedback means coupled to a drain of one of said first transistor or of said second transistor for pulling said drain of said first transistor or of said second transistor to said reference voltage.

3. Logic level shifter of claim 2 wherein said feedback means includes a fifth transistor of a second conductivity type coupled between a drain of said second transistor and said reference voltage with a gate of said fifth transistor connected to a drain of said first transistor.

4. Logic level shifter of claim 2 wherein said fifth transistor is coupled between a drain of said first transistor and said reference voltage and said gate of said fifth transistor is coupled to a drain of said second transistor.

5. Logic level shifter of claim 2, further comprising:

a second output, with a signal at said second output being a complement of a signal at said first output.

6. Logic level shifter of claim 1 wherein said second level voltage supply is applied at a first time and said first level voltage supply is applied at a second time and said second time is later that said first time.

7. Logic level shifter of claim 1 further comprising an inverter for accepting said first logic signal and providing said complement of said first logic signal.

8. A logic level shifter for coupling a first logic circuit having a first voltage level power supply to a second logic circuit, said shifter and said second logic circuit having a second voltage level supply, with said second voltage level supply being present at a time when said first voltage level supply is not present, comprising:

first input means for accepting a first logic signal wherein said first logic signal can vary from a reference voltage to said first voltage;

second input means for accepting a complement of said first logic signal;

first output means for providing a first output which can vary from said reference voltage to said second voltage;

second output means for providing a second output which can vary from said reference voltage to said second voltage;

means for maintaining said first output at said reference voltage and said second output at said second voltage during a first time period when said second voltage level power supply is present and said first level power supply is not present.

9. Logic level shifter of claim 8 wherein said feedback means is coupled to said second output for maintaining said second output at said reference voltage and said first output at said second voltage.

10. A logic level shifter for coupling a first logic circuit having a first voltage level power supply to a second logic circuit, said shifter and said second logic circuit having a second voltage level supply, comprising:

first and second complementary transistors having a first common drain connection and coupled between a second voltage and ground;

third and fourth complementary transistors having a second common drain connection and coupled between said second voltage and ground;

a gate of said first transistor coupled to said second common drain connection;

a gate of said fourth transistor coupled to said first common drain connection;

a first input at a gate of said second transistor;

a second input at a gate of said fourth transistor;

a first output at said second common connection;

a fifth transistor coupled between said second common connection and ground and having a gate coupled to said first common gate connection for maintaining said first output at ground when said second level voltage supply is on and said first level voltage supply is off.

11. Logic level shifter of claim 10 wherein said fifth transistor is coupled between said first common connection and ground and having a gate coupled to said second common gate connection for maintaining said second output at ground when said second level voltage supply is on and said first level voltage supply is off.

* * * * *